(12) United States Patent
Delgadino et al.

(10) Patent No.: US 7,276,447 B1
(45) Date of Patent: Oct. 2, 2007

(54) PLASMA DIELECTRIC ETCH PROCESS INCLUDING EX-SITU BACKSIDE POLYMER REMOVAL FOR LOW-DIELECTRIC CONSTANT MATERIAL

(75) Inventors: Gerardo A. Delgadino, Santa Clara, CA (US); Indrajit Lahiri, Santa Clara, CA (US); Teh-Tien Su, Milpitas, CA (US); Brian Sy-Yuan Sheih, Palo Alto, CA (US); Ashok K. Sinha, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 60 days.

(21) Appl. No.: 11/402,074

(22) Filed: Apr. 11, 2006

(51) Int. Cl.
*H01L 21/311* (2006.01)

(52) U.S. Cl. .................... 438/694; 438/696; 438/700; 438/715; 257/E21.226; 134/1.2; 134/1.3

(58) Field of Classification Search ............... 438/694, 438/696, 700, 905, 906, 963, 908, 924; 257/E21.226; 134/1.2, 1.3
See application file for complete search history.

(56) References Cited

U.S. PATENT DOCUMENTS

| 6,680,164 B2 | 1/2004 | Nguyen et al. | 430/329 |
| 6,733,594 B2 * | 5/2004 | Nguyen | 134/6 |
| 6,991,739 B2 | 1/2006 | Kawaguchi et al. | 216/67 |

* cited by examiner

*Primary Examiner*—George Fourson
*Assistant Examiner*—Julio J Maldonado
(74) *Attorney, Agent, or Firm*—Robert M. Wallace

(57) ABSTRACT

A plasma etch process for etching a porous carbon-doped silicon oxide dielectric layer using a photoresist mask is carried out first in an etch reactor by performing a fluoro-carbon based etch process on the workpiece to etch exposed portions of the dielectric layer while depositing protective fluoro-carbon polymer on the photoresist mask. Then, in an ashing reactor, polymer and photoresist are removed by heating the workpiece to over 100 degrees C., exposing a peripheral portion of the backside of said workpiece, and providing products from a plasma of a hydrogen process gas to reduce carbon contained in polymer and photoresist on said workpiece until the polymer has been removed from a backside of said workpiece. The process gas preferably contains both hydrogen gas and water vapor, although the primary constituent is hydrogen gas. The wafer (workpiece) backside may be exposed by extending the wafer lift pins.

18 Claims, 5 Drawing Sheets

PLASMA DIELECTRIC ETCH PROCESS INCLUDING EX-SITU BACKSIDE POLYMER REMOVAL FOR LOW-DIELECTRIC CONSTANT MATERIAL

BACKGROUND OF THE INVENTION

Integrated circuit performance is being continually improved by increasing device switching speed, increasing interconnection density and reducing cross-talk between adjacent conductors. Switching speeds have been increased and cross-talk reduced by employing new dielectric thin film material having low dielectric constant, such as porous carbon-doped silicon dioxide. Interconnections have been increased by increasing the number of interconnected conductive layers and reducing feature size (e.g., line widths, hole diameters). Connecting between such deep layers entails high aspect ratio (deep and narrow) conductor openings or "vias". Such fine features have required photoresist (for photolithography) adaptable to shorter wavelengths. Such photoresist tends to be thinner and more prone to form imperfections such as pin holes or striations during the dielectric etch process. This problem is addressed by employing a fluorocarbon chemistry during the plasma etch of the dielectric inter-layer insulation film, in order to deposit a protective fluorocarbon polymer on the photoresist. The polymer must be removed from the wafer after the etch process in order to avoid contaminating later process steps that must be performed on the wafer. Therefore, a post-etch polymer removal step is performed. However, in the post-etch polymer removal step, it is difficult to remove all of the deposited polymer. This is because some polymer penetrates through a gap between the wafer edge and a ring collar process kit at the wafer pedestal periphery, and accumulates on the wafer backside at the periphery. Such a gap is required to avoid interference with the electrostatic chuck (ESC) that forcibly clamps the wafer to a cooled surface to meet the temperature control requirements of the plasma etch process. The wafer edge-to-ring collar gap is too narrow for plasma to penetrate and remove the polymer from the wafer backside during the post-etch polymer removal step. Therefore, a conventional approach to this problem has been to employ an oxygen plasma in the post-etch polymer removal step, to oxidize carbon-containing materials (such as polymer and photoresist), followed by dipping the wafer in liquid HF acid. This step can employ a separate relatively inexpensive "ashing" chamber having a heated wafer support pedestal capable of relatively high wafer temperatures (e.g., 300 or more degrees) with a simple remote plasma source. This process does not harm a conventional dielectric material such as silicon dioxide, which is a strong material. However, such an oxidizing process does catastrophic harm to the newer low dielectric constant insulator materials such as porous carbon-doped silicon dioxide. The oxidizing chemistry of the post-etch clean step removes the carbon from the carbon-doped silicon dioxide dielectric material, the carbon eventually being replaced by water from the atmosphere. This greatly increases the dielectric constant of the insulator, removing its main advantage. Such damage is apparent as undercutting of the dielectric layer sidewalls viewed in a profile image. This undercutting is revealed upon dipping the wafer in dilute acid following the post-etch clean step. Another problem is that such an oxidizing process does not completely remove the backside polymer, even after 60 seconds, according to our investigation.

Therefore, what is needed is a way of completely and quickly removing polymer from the wafer backside that does not damage the low-dielectric constant insulator material without requiring any extra process time.

SUMMARY OF THE INVENTION

A plasma etch process for etching a porous carbon-doped silicon oxide dielectric layer using a photoresist mask is carried out first in an etch reactor by performing a fluorocarbon based etch process on the workpiece to etch exposed portions of the dielectric layer while depositing protective fluoro-carbon polymer on the photoresist mask. Then, in an ashing reactor, polymer and photoresist are removed by heating the workpiece to over 100 degrees C., exposing a peripheral portion of the backside of said workpiece, and providing products from a plasma of a hydrogen process gas to reduce carbon contained in polymer and photoresist on said workpiece until the polymer has been removed from a backside of said workpiece. The process gas preferably contains both hydrogen gas and water vapor, although the primary constituent is hydrogen gas. The wafer (workpiece) backside may be exposed by extending the wafer lift pins.

DETAILED DESCRIPTION OF THE INVENTION

Figure 1:
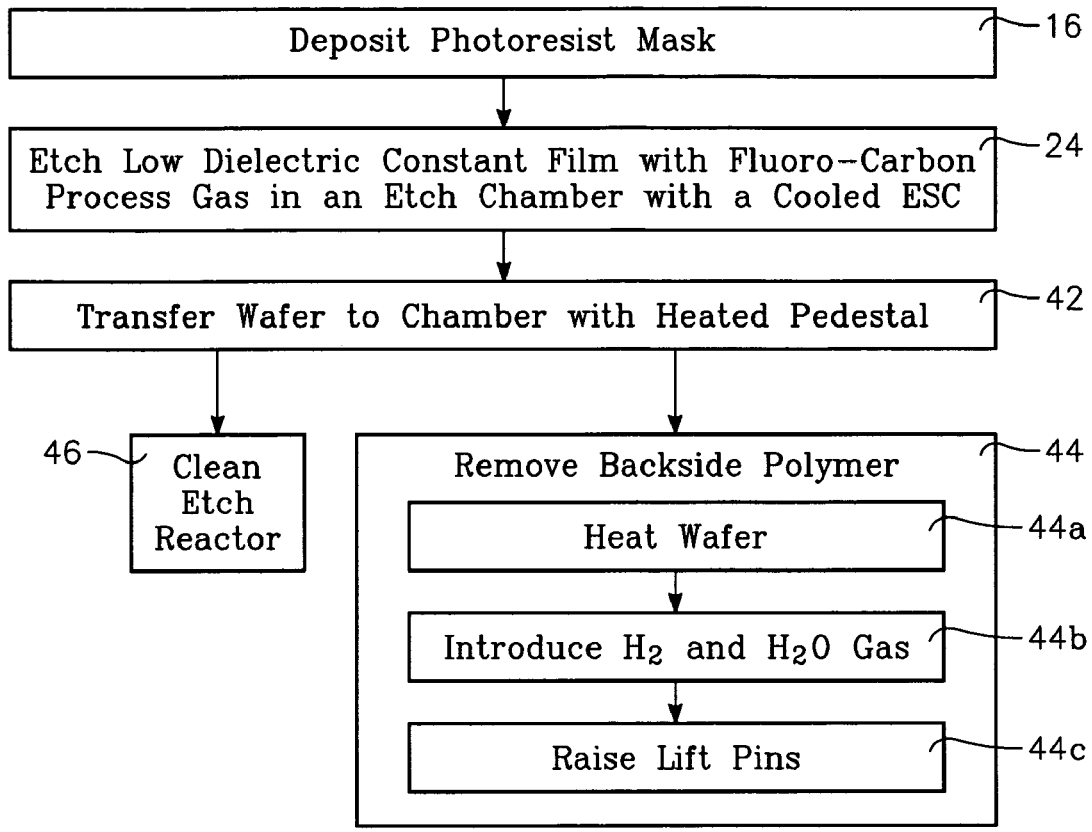
FIG. 1 is a block flow diagram depicting a process embodying the invention.
Figure 2:
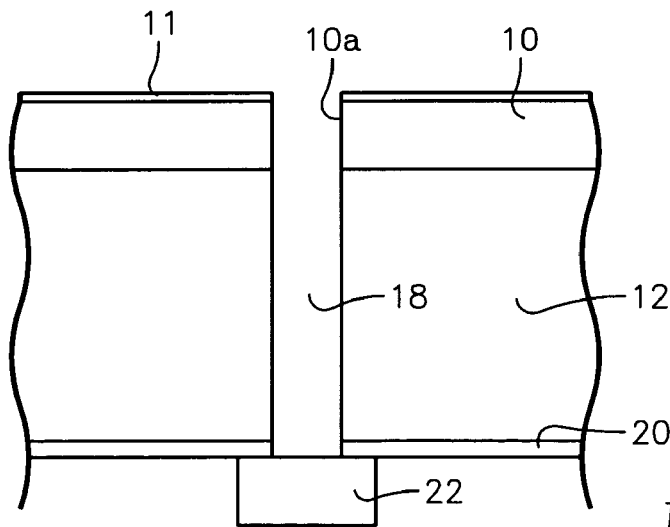
FIG. 2 depicts a device formed by the process of FIG. 1.

The invention is based upon our discovery of an etch process for a low dielectric constant material including a post etch polymer removal step that thoroughly removes both backside polymer and photoresist with no appreciable damage to the low dielectric constant insulator layer (e.g., porous carbon-doped silicon dioxide or a porous organosilicate material), and does so in less than 60 seconds. An etch process embodying the invention is depicted in FIG. 1, while FIG. 2 depicts one example of a thin film structure that can be formed using the process of FIG. 1. A photoresist mask 10 depicted in FIG. 2 is deposited on a dielectric layer 12, the mask 10 having an aperture 10a corresponding to a feature 18 that is to be etched in the dielectric layer 12. This corresponds to the step of block 16 of FIG. 1. The feature may be a narrow via 18. The via 18 extends through the dielectric layer 12 and through a barrier layer 20 to expose the top surface of a copper line 22. The dielectric layer is a low dielectric constant material, such as porous carbon-doped silicon dioxide. The barrier layer 20 may be silicon carbide. In the step of block 24 of FIG. 1, the via 18 of FIG. 2 is formed by etching away the portion of the dielectric material 12 lying above the dashed line, using a plasma of a fluoro-carbon-containing process gas. This step is carried out in a plasma etch reactor, such as a capacitively coupled plasma etch reactor of the type depicted in FIG. 3 for processing a wafer 28. The etch reactor of FIG. 3 has a sidewall 30, an overhead electrode/gas showerhead 32 fed by a gas panel 32a and RF-driven by an RF plasma source power generator 33a through an impedance match 33b, an electrostatic chuck 34 with an internal electrode 36 controlled by a D.C. chucking voltage controller 36a and driven by an RF bias generator 37a through an impedance match 37b, and a ring collar 38 or process kit underlying the peripheral portion of the wafer 28 extending beyond the chuck 34. The gap 39 between the collar 38 and the backside of the wafer 28 prevents interference by the collar 38 with wafer-clamping function of the electrostatic chuck 34 when a D.C. chucking voltage is applied to the electrode 36. During the etch step of block 24 of FIG. 1, the fluoro-carbon process gas dissociates into simple fluoro-carbon etch species and heavier or carbon-rich polymer-forming species that form a protective layer 11 on the photoresist 10 of FIG. 2. The polymer-forming species travel through the wafer-collar gap to form an annular backside polymer layer 40 on the backside of the wafer 28.

Figure 3:
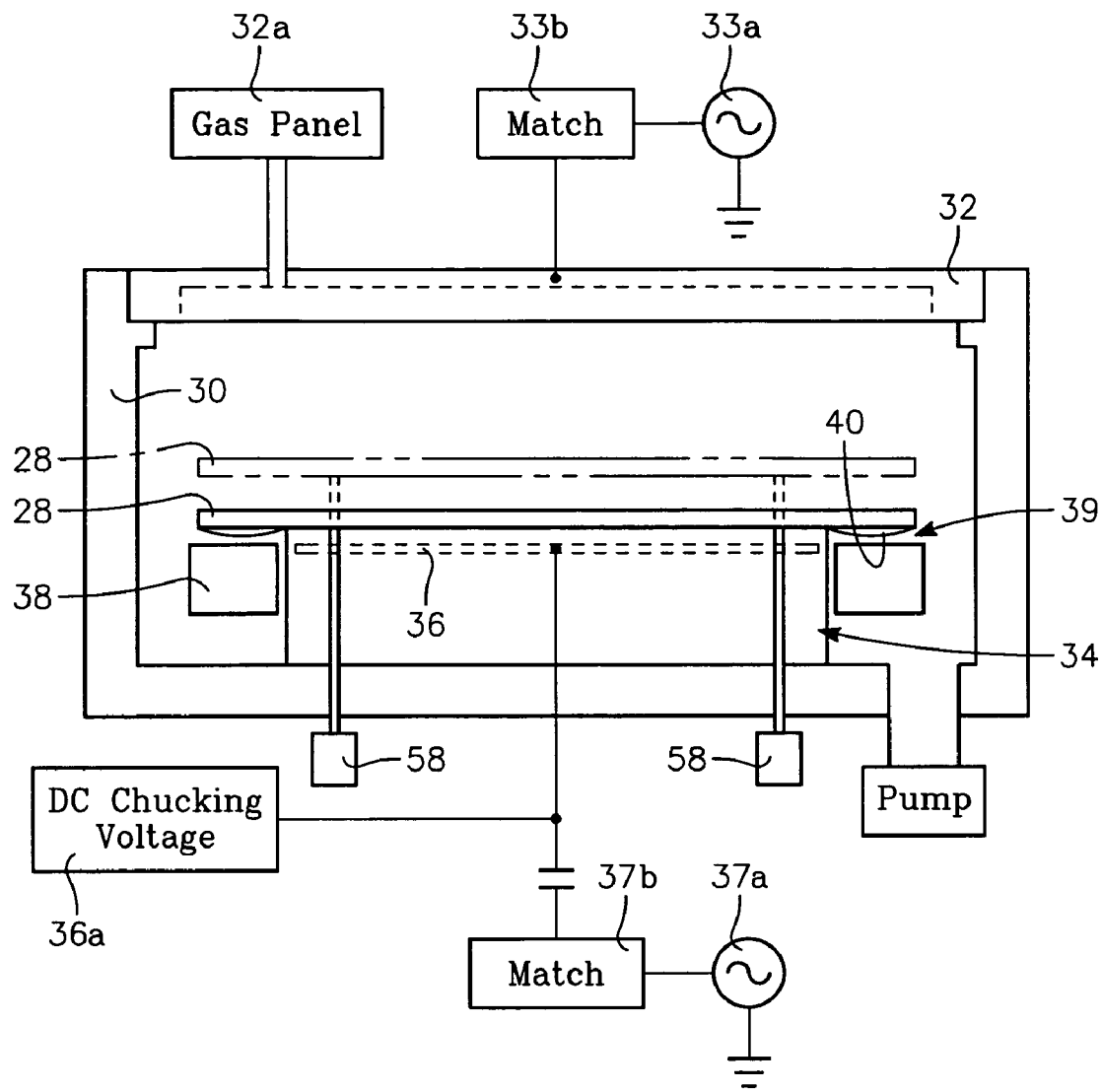
FIG. 3 depicts a preferred plasma etch reactor for carrying out the invention.
Figure 4A:
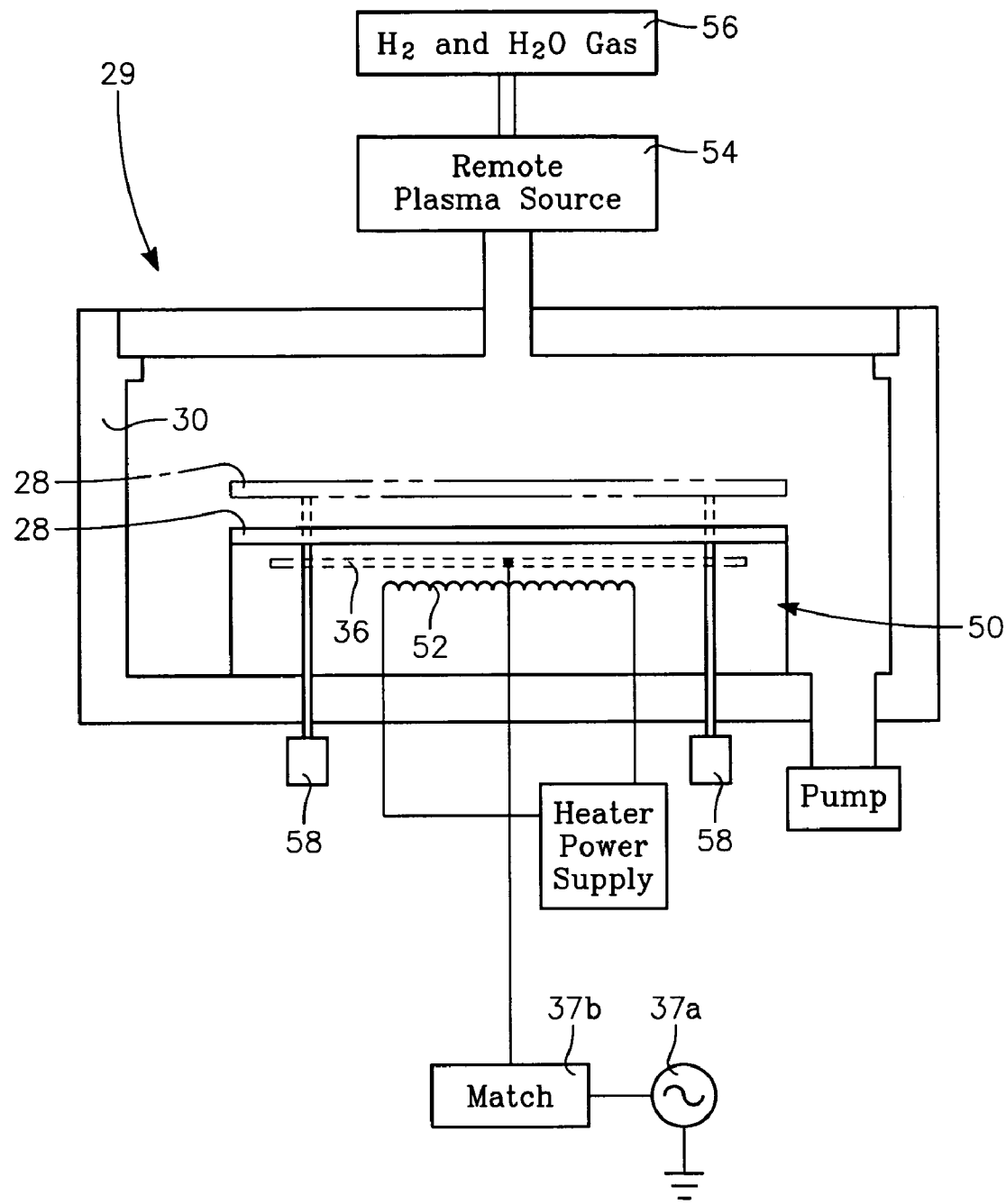
FIG. 4A depicts a process step of the invention performed in an ashing chamber.
Figure 4B:
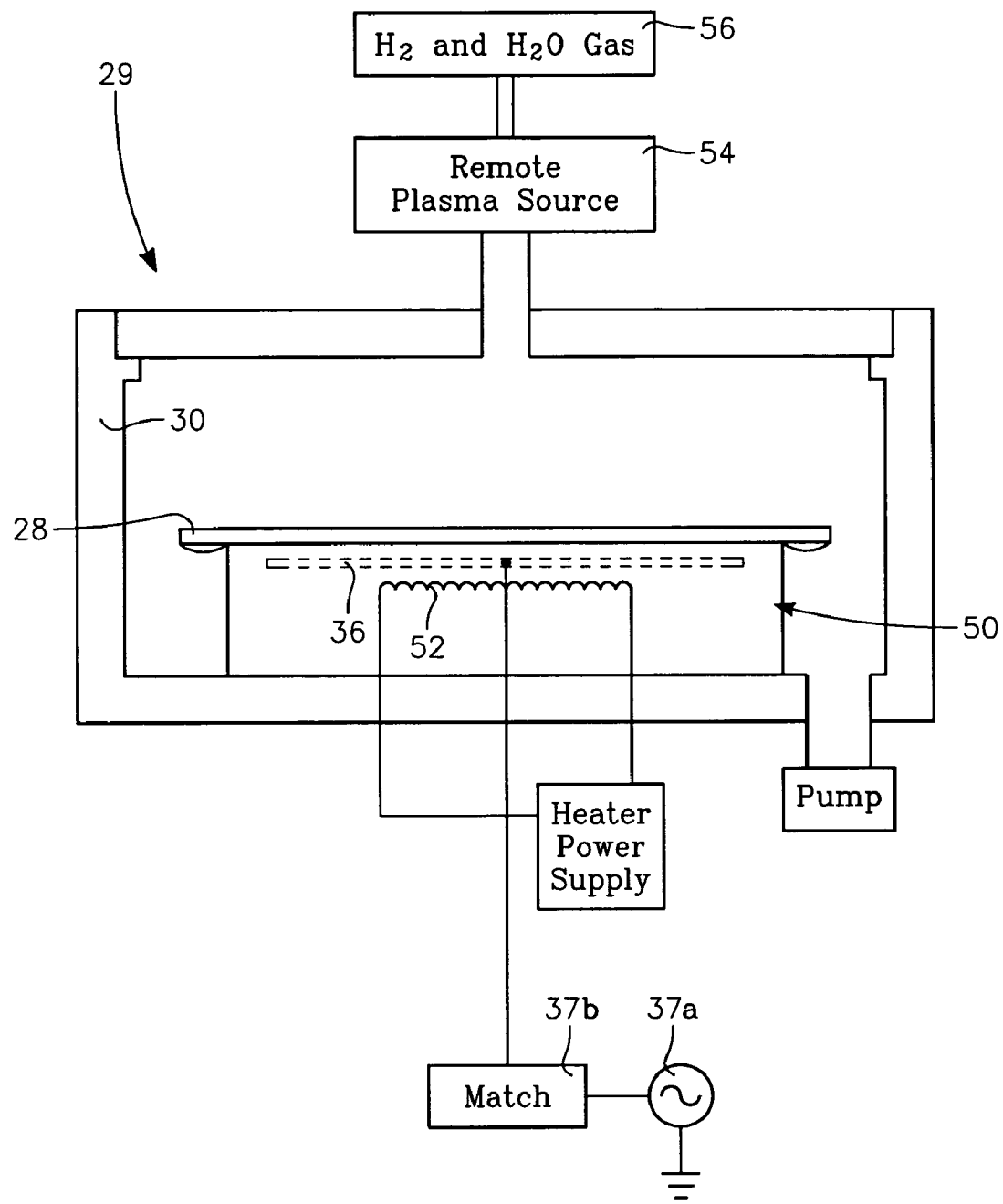
FIG. 4B depicts a process step of the invention performed in an ashing chamber in an alternative embodiment in which the wafer backside edge is exposed without having to extend the lift pins.

In the next step, block 42 of FIG. 2, the wafer 28 is removed from the etch chamber of FIG. 3 and placed in an ashing chamber 29 illustrated in FIG. 4A. The principal distinction of the ashing chamber 29 of FIG. 4A is that it has a heated wafer support 50 and is designed to heat the wafer to very high temperatures (e.g., 400 degrees C.) and high pressure (e.g., several Torr), and employs a remote plasma source 54 as a relatively inexpensive expedient. (In contrast, the etch chamber of FIG. 3 must cool the wafer to a precise temperature to attain acceptable etch performance, and therefore must employ the electrostatic chuck 34 to clamp the wafer to a cooled surface, the chuck 34 typically being capable of heating the wafer to only 60 degrees C., the reactor operating at very low pressures, in the milliTorr range.) The ashing chamber of FIG. 4A has a heater 52 inside the wafer support 50 capable of heating the wafer 28 to hundreds of degrees C. A remote plasma source 54 generates a plasma from a process gas provided by a process gas supply 56. The wafer 28 may be lifted and lowered onto the support 50 by lift conventional pins 58. The ashing chamber of FIG. 4A is conventional. The bias power generator 37a and impedance match 37b and electrode 36 illustrated in FIG. 4A are optional and not necessarily required in the ashing chamber. In an alternative mode, the ashing chamber of FIG. 4B may be employed instead of the ashing chamber of FIG. 4A. The ashing chamber of FIG. 4B differs from that of FIG. 4A in that in FIG. 4B, the wafer support 50 has a diameter that is less than that of the wafer 28, so that the periphery of the wafer backside is exposed without having to extend the lift pins. The chamber of FIG. 4B is conventional, and may not necessarily include the ESC electrode 36 and bias power generator 37a or match 37b. When using the modified ashing chamber of FIG. 4B, the step of block 44c of extending the lift pins may be eliminated.

In the next step, block 44 of FIG. 1, the backside polymer film 40 of FIG. 3 and the photoresist mask 10 of FIG. 2 are removed. This step begins by placing the wafer 28 on the heated wafer support 50 with the lift pins 58 retracted so that the wafer 28 contacts the wafer support 50, and then heating the wafer 28 to a very high temperature (e.g., 200-300 degrees C.), corresponding to the step of block 44a of FIG. 1. Next, in the step of block 44b, hydrogen gas and water vapor are introduced into the remote plasma source 54 and plasma RF source power (on the order of 7500 Watts) is applied to the remote plasma source (RPS) to generate a plasma. Plasma products (e.g., neutrals) from the RPS 54 reach the interior of the ashing chamber 29 and create an environment in which polymer is reduced (rather than being oxidized) and thus removed from the wafer. The reducing agent is hydrogen. It is preferable to include water vapor in the hydrogen process gas because it has been found that the population of free hydrogen in the chamber is increased more with the addition of water than with the addition of further hydrogen. We have observed this phenomenon with optical emission spectrometry, which indicates a disproportionate increase in the hydrogen line magnitude with the addition of water vapor. This increase in hydrogen in the ashing chamber increases the rate at which polymer is reduced. The next step (block 44c of FIG. 1) is to extend the lift pins 58 to lift the wafer 28 above the wafer support 50 and thereby expose the wafer backside. This step is carried out for a very short period of time (e.g., 60 seconds), during which all of the backside polymer film 40 is completely removed. It is a discovery of the present invention that a reducing chemistry (e.g., hydrogen-based) may be employed in the ashing reactor 29 to completely remove backside polymer and photoresist in less than 60 seconds. Apparently, the hydrogen in the process gas reduces carbon in the polymer by forming hydro-carbon compounds, but performs very little or no reduction of the carbon in the porous carbon-doped silicon dioxide dielectric material (the insulator layer 12 of FIG. 2).

We have found that the wafer heating step of block 44a is important because at lower wafer temperatures the polymer removal process takes a longer time, during which damage to the low dielectric constant insulator layer 12 of FIG. 2 increases beyond a negligible level.

Figure 5:
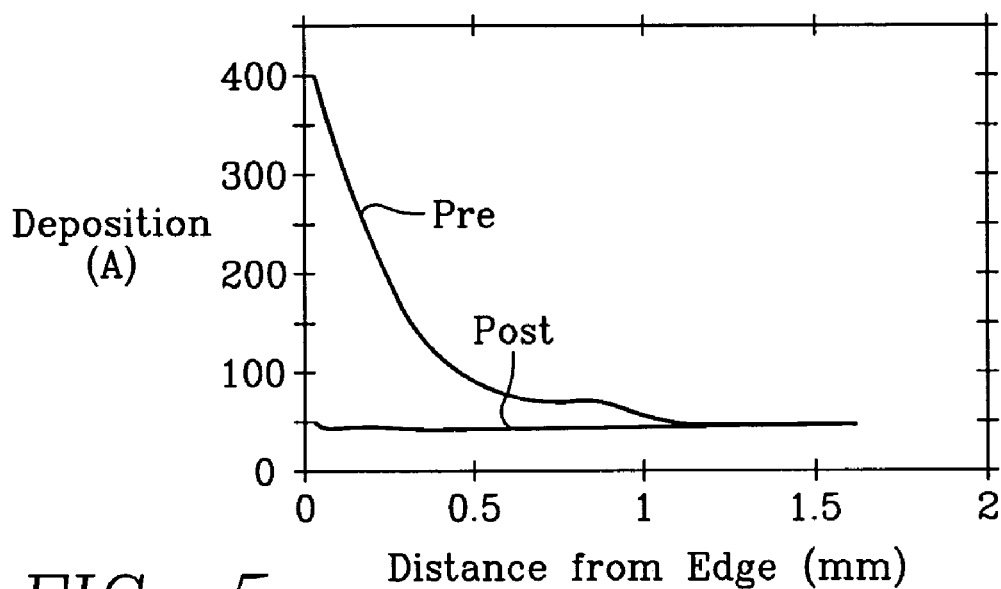
FIG. 5 is a graph depicting the radial distribution of polymer thickness obtained in the invention (flat line) and prior to the polymer removal step (curved line).

Another surprise is that the reducing or hydrogen-based chemistry was found to more thoroughly and quickly remove the backside polymer than a conventional oxidizing chemistry. Our measurement of backside polymer thickness from two different wafers is illustrated in the graph of FIG. 5. The steep curve of FIG. 5 represents the condition of the wafer prior to performing the polymer removal step, and indicates a large amount of backside polymer remaining after a 60 second oxidizing etch step. The flat curve of FIG. 5 was obtained in the method of FIG. 1, in which a reducing chemistry is employed in the ashing reactor 29, and indicates a complete removal of all backside polymer. Thus, one surprising result is that the reducing chemistry works faster than the oxidizing chemistry. Another surprising result is that the reducing chemistry causes no observable damage to the low dielectric constant insulator material 12 (whereas the oxidizing chemistry causes catastrophic damage to the low dielectric constant insulator material). Damage to porous carbon-doped silicon dioxide dielectric thin film was ascertained in our investigations by carrying out the dielectric etch step, then carrying out the backside polymer removal step and finally dipping the wafer in dilute HF. Thereafter, a scanning electron microscope image of the etch profile was obtained. For those wafers processed using the conventional oxidizing post-etch polymer removal technique, the etch profile images revealed large undercutting of the etched structures. However, for those wafers in which the post etch backside polymer removal step employed a reducing chemistry, very little undercutting or damage to the porous carbon-doped silicon dioxide was visible in the SEM images of the etch profile, the undercutting being no more than 2 nm or less (a negligible amount). This step is so thorough and efficient in its removal of carbon-based films that all photoresist is removed simultaneously with the backside polymer removal.

One advantage of transferring the wafer 28 in the step of block 42 is that an opportunity is created to clean the interior of the etch reactor of FIG. 3 before performing each etch step. The cleaning may be performed using a plasma containing species (oxygen or ammonia or others) that rapidly etch polymer from chamber interior surfaces. The advantage of such an intervening chamber cleaning step is that polymer from prior etch steps will not accumulate in the chamber to release fluorine or other materials during subsequent etch steps. Therefore, the etch chamber is cleaned in the step of block 46 upon completion of the wafer transfer step of block 42.

Figure 6:
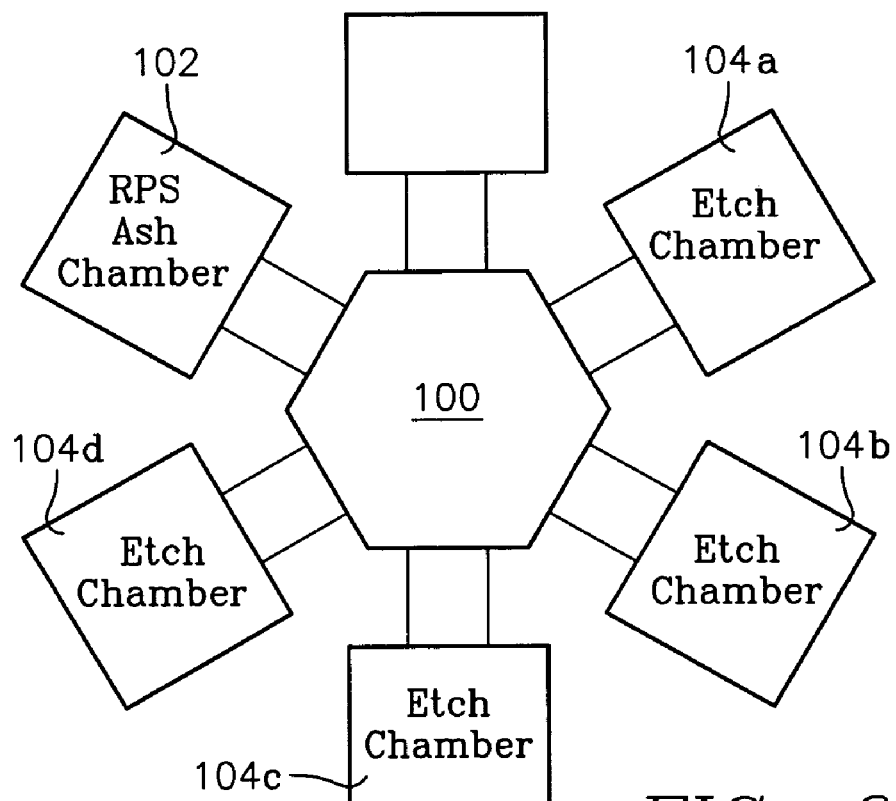
FIG. 6 depicts a processing system in accordance with a further aspect of the invention.

The invention can be employed not only to solve the problem of backside polymer removal in the presence of low dielectric constant insulator films, but also to triple or quadruple etch productivity without a proportionate increase in capital expense. In conventional practice, the entire plasma etch process beginning with the main step of etching through the dielectric material to form a via or a trench (for example) in an etch reactor, and concluding with the removal of the photoresist and polymer in an ashing reactor, took about 400 seconds, of which 160 seconds were spent in the ashing reactor, and the remainder (240 seconds) were spent in the etch reactor. The discovery of a polymer and photoresist removal step that takes less than 60 seconds and perhaps as little as 40 seconds makes possible a 3-fold or 4-fold increase in overall etch productivity with little increase in capital expense. FIG. 6 illustrates how this is accomplished. In a single tool, a central wafer transfer unit 100 is coupled to one ashing reactor 102 of the type depicted in FIG. 4 and three or four etch reactors 104a, 104b, 104c, 104d, of the type depicted in FIG. 3. The tool of FIG. 6 is operated in accordance with the following procedure: during the 240 second time duration of a single etch step performed by the four etch reactors 104, the ash reactor performs, successively, backside polymer and photoresist removal on four different wafers previously processed by the four etch reactors 104, and at the end of the 240 second etch process performed simultaneously in the etch reactors 104, the ash reactor 102 is ready to repeat the same task on the current set of four wafers processed by the four etch reactors.

In one example of the backside polymer removal step of block 44, 7500 Watts of RF source power was applied to the remote plasma source 54 of the ashing reactor 29 (FIG. 4) while 7500 sccm of hydrogen gas and 350 sccm of water vapor was supplied to the RPS 54 while the ashing reactor chamber pressure was 3 Torr. In general, the process gas from which the RPS 54 generates the plasma is primarily pure hydrogen gas at least a portion of which dissociates into free hydrogen. Water vapor content is a fraction of the hydrogen content of the process gas, and is adjusted to maximize the free hydrogen content of the gas, as indicated by an optical emission spectrometer. The water vapor flow rate is typically only a fraction of the hydrogen gas flow rate into the RPS 54 or plasma generation region, as little as one tenth or one twentieth of the hydrogen flow rate (as in the example above). It may be possible to eliminate the water vapor from the process gas, although such a choice is not preferred.

What is claimed is:

1. A plasma etch process, comprising:
   providing a workpiece having a porous carbon-doped silicon oxide dielectric layer;
   defining a photoresist mask on a surface of the workpiece;
   in an etch reactor:
      performing a fluoro-carbon based etch process on the workpiece to etch exposed portions of the dielectric layer while depositing protective fluoro-carbon polymer on the photoresist mask;
   transferring said workpiece to an ashing reactor and in said ashing reactor:
      heating the workpiece to over 100 degrees C.;
      exposing a peripheral portion of the backside of said workpiece; and
      providing products from a plasma of a hydrogen process gas to reduce polymer and photoresist on said workpiece until the polymer has been removed from a backside of said workpiece.

2. The process of claim 1 wherein said hydrogen process gas contains pure hydrogen.

3. The process of claim 1 wherein said hydrogen process gas contains both hydrogen gas and water vapor.

4. The process of claim 1 wherein the step of exposing a peripheral portion of the backside of the wafer comprises extending lift pins in a wafer support of said ashing reactor to lift the wafer and expose a backside of the wafer.

5. The process of claim 1 wherein the step of exposing a peripheral portion of the backside of the wafer comprises providing a wafer support in the ashing reactor having a diameter less than a diameter of the wafer.

6. The process of claim 1 wherein the step of providing products from a plasma of a hydrogen process gas to reduce polymer is carried out until all polymer has been removed from a backside of said workpiece.

7. The process of claim 1 wherein the step of providing products form a plasma of a hydrogen process gas to reduce polymer is carried out until all polymer and photoresist has been removed from the workpiece.

8. The process of claim 1 further comprising generating said plasma by flowing hydrogen gas at a first rate and water vapor at a second rate into a plasma generating region, wherein said first rate exceeds said second rate.

9. The process of claim 8 wherein said first rate is more than ten times said second rate.

10. The process of claim 8 wherein said first rate is more than 20 times said second rate.

11. The process of claim 8 wherein said plasma generating region comprises a remote plasma source coupled to said ashing reactor, and the step of flowing hydrogen gas and water vapor into a plasma generating region comprises flowing them into the remote plasma source.

12. The process of claim 1 further comprising:
   after transferring said workpiece to said ashing reactor, performing a plasma cleaning step in said etch reactor to remove polymer from interior chamber surfaces of said etch reactor.

13. A plasma etch process, comprising:
   providing plural workpieces each having a carbon-doped silicon oxide dielectric layer;
   defining a photoresist mask on a surface of each workpiece;
   in plural etch reactors:
      performing a fluoro-carbon based etch process on the respective workpieces in respective etch reactors simultaneously to etch exposed portions of the respective dielectric layers while depositing protective fluoro-carbon polymer on the respective photoresist masks;
   in an ashing reactor, performing the following steps on successive ones of the plural workpieces in a time window not exceeding that required to once perform said fluoro-carbon based etch process in each etch reactor:
  heating the workpiece to over 100 degrees C.;
  exposing a peripheral portion of the backside of said workpiece; and
  providing products from a plasma of a hydrogen process gas to reduce polymer and photoresist on said workpiece until the polymer has been removed from a backside of said workpiece.

14. The process of claim 13 wherein the steps performed in said ashing reactor are carried out while simultaneously said etch process is repeated on a successive set of plural workpieces in the plural etch reactors simultaneously.

15. The process of claim 13 wherein said hydrogen process gas contains pure hydrogen.

16. The process of claim 13 wherein said hydrogen process gas contains both hydrogen gas and water vapor.

17. The process of claim 13 wherein the step of exposing a peripheral portion of the backside of the wafer comprises extending lift pins in a wafer support of said ashing reactor to lift the wafer and expose a backside of the wafer.

18. The process of claim 13 wherein the step of exposing a peripheral portion of the backside of the wafer comprises providing a wafer support in the ashing reactor having a diameter less than a diameter of the wafer.

* * * * *